United States Patent [19]

Duley

[11] Patent Number: 5,614,807
[45] Date of Patent: Mar. 25, 1997

[54] BATTERY CHARGE INDICATOR

[75] Inventor: Raymond S. Duley, Buda, Tex.

[73] Assignee: Advanced Micro Devices, Inc., Sunnyvale, Calif.

[21] Appl. No.: 279,503

[22] Filed: Jul. 22, 1994

[51] Int. Cl.$^6$ .................................................. H02J 7/04
[52] U.S. Cl. .............................. 320/48; 324/428; 340/636
[58] Field of Search ........................... 320/2, 48; 324/428, 324/430; 340/636

[56] References Cited

U.S. PATENT DOCUMENTS

| | | | |
|---|---|---|---|
| 4,027,231 | 5/1977 | Lohrmann | 324/29.5 |
| 4,536,757 | 8/1985 | Ijntema | 340/636 |
| 4,876,632 | 10/1989 | Ousterhout et al. | 362/183 |
| 5,105,180 | 4/1992 | Yamada et al. | 340/636 |
| 5,345,392 | 9/1994 | Mito et al. | 364/483 |

Primary Examiner—Matthew V. Nguyen
Assistant Examiner—Gregory J. Toatley, Jr.
Attorney, Agent, or Firm—Kevin L. Daffer; Conley, Rose & Tayon

[57] ABSTRACT

A low-cost battery charge indicator is provided which is capable of indicating a quantity of charge upon a battery or battery pack. The charge indicator includes positive and negative battery terminals and a charge gauge circuit mounted within a battery pack or a battery-powered electronic device. The positive and negative terminals are adapted to receive a battery and to test the battery charge within the battery during times in which the charge gauge circuit is active. Activation of the charge gauge circuit occurs by depressing a momentary switch coupled between the charge gauge circuit and the battery terminals. Upon activation of the switch, one of three LEDs will emit light informing the user of the state of charge upon the battery or battery pack. The switch remains normally open to avoid current draw from the battery during non-test times.

16 Claims, 1 Drawing Sheet

BATTERY CHARGE INDICATOR

BACKGROUND OF THE INVENTION

1. Field of the Invention

This invention relates to an electronic circuit and more particularly to a battery charge indicator which indicates, during use, a quantity of charge upon a battery.

2. Description of the Relevant Art

There are many techniques commonly used for indicating existing charge within a battery. A popular charge indicating technique includes the use of resistive strips which can be coupled across the battery. The resistive strips emit light indicative of one of two possible charge conditions. The strips can be applied by the operator to opposing terminals of the battery in order to indicate either an adequately charged or an inadequately charged battery. If adequately charged, the resistive strips emit a visible light dissimilar from the light emitted if the battery is inadequately charged. The resistive strips are fairly inexpensive and are generally packaged with the battery and are shipped by the manufacturer to the end user. The end user can then test the battery prior to inserting it into a battery-powered device.

While pre-packaged battery indicators provide the user relative indication of battery charge, pre-packaged indicators are of no use after the battery is inserted into the battery-powered device. In other words, the resistive strips cannot be used to check the battery charge in situ (i.e., during times in which the battery is seated within the electronic device). Generally, batteries lose their charge over time or after prolonged periods of use. To determine the existing charge using resistive strips, the battery must be removed from the electronic device and placed across the strips. Removal of the battery each time for testing can be burdensome and inconvenient.

Inconvenience associated with removal of a seated battery is compounded by the fact that resistive strips can only test one battery at a time. If numerous batteries are necessary to power an electronic device, each battery must be removed and placed between the resistive strips.

SUMMARY OF THE INVENTION

The problems outlined above are in large part solved by the battery charge indicator of the present invention. That is, the battery charge indicator hereof is built within the battery powered electronic device and, with activation of a momentary switch, indicates in situ the existing charge of a battery or a pack of batteries. Individual batteries within a pack of batteries need not be removed for testing. Depending upon the number of batteries seated within the electronic device, the charge on a plurality of batteries can be tested during electronic device operation or during interim periods between device operations.

The battery charge indicator includes three light emitting diodes (LED) which are lit at discrete luminous intensities. Each LED is either fully on or fully off to provide clear indication of the presence or absence of charge. There are at least three LEDs: one LED is dedicated for illuminating red visible wavelength, another LED for illuminating yellow visible wavelength, and another LED for illuminating green visible wavelength. A green illuminated LED can be selected to indicate a fully charged condition, the yellow illuminated LED can indicate an intermediate charge (not fully charged and not fully discharged), and the red illuminated LED can indicate a discharged condition.

The battery charge indicator includes a positive terminal and a negative terminal mounted within a battery-driven portable electronic device. The positive and negative terminals are connected (i.e., are adapted for frictional engagement) across the battery. Battery is defined herein as a single battery of a pack of plural batteries having positive and negative terminals extending therefrom. The battery charge indicator further includes a charge gauge circuit coupled between the positive and negative terminals. The charge gauge circuit can be selectively activated or deactivated by a switch coupled between the charge gauge circuit and the negative terminal. The charge gauge switch is normally open and can be momentarily closed by application of a manual force. Accordingly, the charge gauge circuit is normally disconnected from the negative terminal and thereby does not add to the load of the electronic device. Therefore, unless the switch is depressed, the charge gauge circuit is not connected across the terminals of the battery and therefore cannot sink power from the battery. If the switch is depressed, and the charge gauge circuit is coupled across the battery, the charge gauge circuit utilizes resistors of large resistive values within voltage dividers coupled between the terminals and high impedance comparators attached to the voltage dividers. Large resistance values ensure minimal power drain asserted during battery test operations. Accordingly, battery tests can be performed either between or during times in which the electronic device is operational. A portion of the battery charge indicator (i.e., charge gauge circuit) can operate in situ to test a single battery or a pack of batteries as the batteries are being drawn upon by an electronic device (load).

Broadly speaking, the present invention contemplates a battery charge indicator. The battery charge indicator includes a charge gauge circuit coupled between positive and negative terminals, wherein the positive and negative terminals are connected to a battery. The charge gauge circuit comprises a first voltage divider coupled between a reference voltage and the negative terminal. A second voltage divider is also provided and coupled between the positive terminal and the negative terminal. The charge gauge circuit further includes a first comparator having an inverting and a non-inverting pair of inputs. The non-inverting input is coupled to a first voltage divide node within the first voltage divider and the inverting input is coupled to a first voltage divide node within the second voltage divider. A second comparator is also provided having an inverting and a non-inverting pair of inputs. The inverting input is coupled to a second voltage divide node within the first voltage divider and the non-inverting input is coupled to the first voltage divide node within the second voltage divider. A third comparator is also provided having an inverting and a non-inverting pair of inputs. The inverting input is coupled through a diode to an output of each of the first and second comparators, and the non-inverting input is coupled to the second voltage divide node within the first voltage divider. Three light emitting diodes are coupled as respective outputs of each of the first, second and third comparators adapted for emitting visible light from one of the three light emitting diodes corresponding to the amount of charge within the battery.

The battery charge indicator is mounted within a battery-driven portable electronic device, or within a unit used to power a portable electronic device. As defined herein, the battery-driven portable electronic device is any device which can receive a battery. The battery can be a non-rechargeable or rechargeable battery. Further, the battery-driven electronic device can include a device which requires minimum battery charge levels, such as those devices which incorporate dynamic memory (memory which requires minimum power levels for periodic refresh). The first voltage divider and the second voltage divider include three resistors and two resistors, respectively. Resistors within the first and second voltage dividers are selected at a ratio which provides sensing of charge levels upon the positive (or negative) terminals mounted within the battery-driven electronic device. Since voltages at various nodes within the first and second voltage dividers are compared at the inputs of the first and second comparators, output node from the first and second comparators are fed through diodes to one input of a third comparator which is then compared with a voltage at the other input of the third comparator. Output transitions to a low state of the first, second and third comparators are used to activate the light emitting diodes according to compared voltages at the comparator inputs resulting from charge status of a connected battery.

BRIEF DESCRIPTION OF THE DRAWINGS

Other objects and advantages of the invention will become apparent upon reading the following detailed description and upon reference to the accompanying drawings in which.

Figure 1:
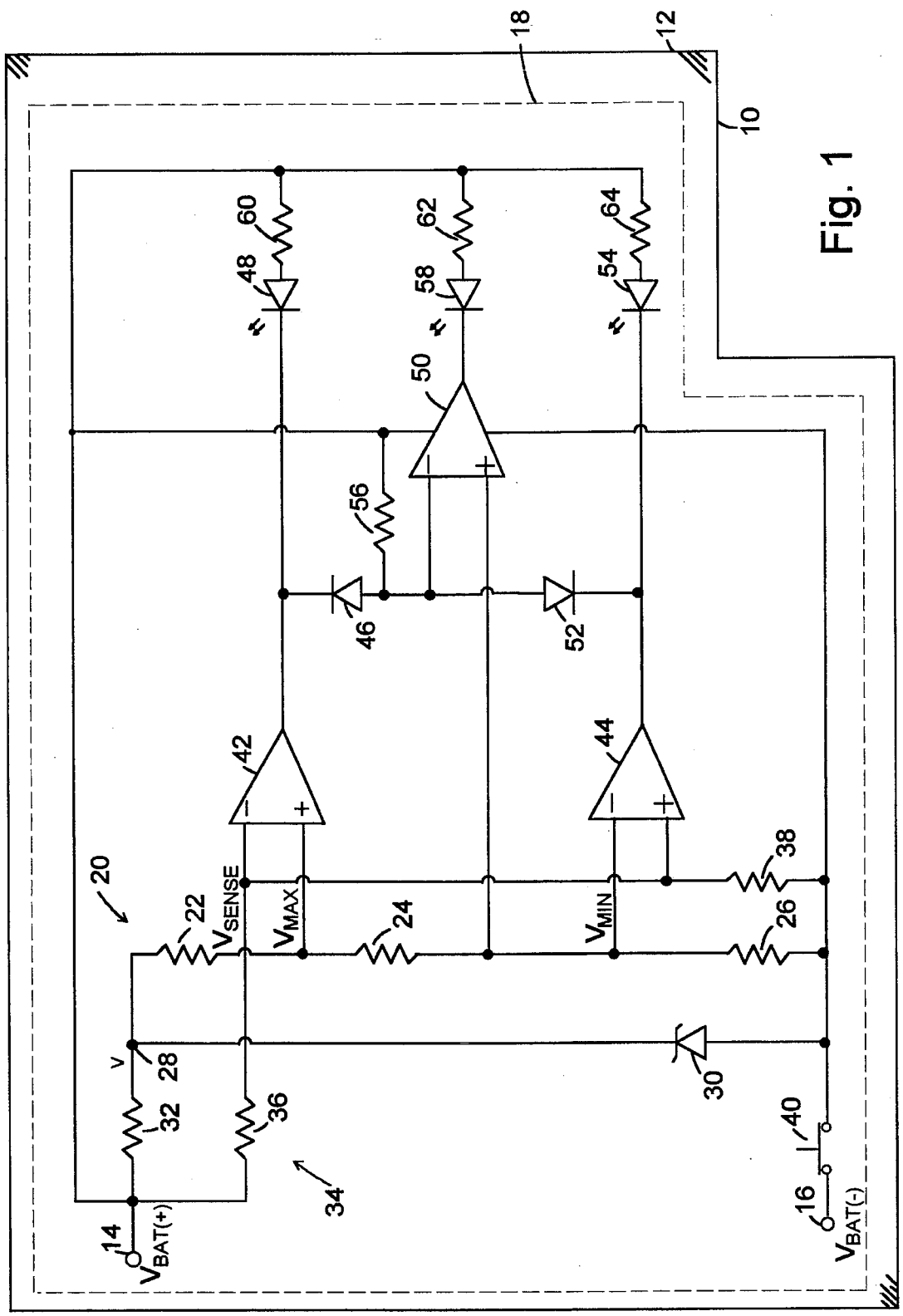
FIG. 1 is a circuit schematic of a battery charge indicator, including positive and negative battery terminals, and charge gauge circuit connected therebetween.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, a circuit schematic of a battery charge indicator 10 is shown. Charge indicator 10 is mounted within a battery-driven portable electronic device 12. Electronic device 12 includes any device capable of receiving power from a self-contained power unit, such as a battery (either rechargeable or non-rechargeable). The battery is frictionally engaged between positive terminal 14 and negative terminal 16. Engagement of the battery within indicator 10 and electrical seating between terminals 14 and 16 ensures electrical connectivity of the battery to a charge gauge circuit 18. Charge gauge circuit 18 is coupled between positive and negative terminals 14 and 16, respectively. Charge gauge circuit 18 is adapted for receiving power of various voltage and current levels, from either a single battery or a plurality of batteries connected in series or parallel (i.e., "battery pack"). The batteries are preferably NiCAD or NiMH batteries, but can include other types of batteries as well.

Charge gauge circuit 18 includes a first voltage divider 20 coupled between a reference voltage ($V_{REF}$) and negative terminal 16 ($V_{BAT(-)}$). First voltage divider 20 includes three series-coupled resistors: resistor 22, resistor 24 and resistor 26. Reference voltage is fixed at a reference terminal 28 by a zener diode 30. Zener diode 30 operates in the reverse-bias region, where current begins to flow at some voltage and increases dramatically with further increases in voltage. Used as a reference, zener diode 30 provides a roughly constant voltage. Resistor 32, coupled between diode 30 and a higher supply voltage coupled at positive terminal 14 ($V_{BAT(+)}$), provides a current limit for zener diode 30. Zener diode 30 can be obtained in numerous voltage values and with numerous power ratings, anywhere from 2 to over 200 volts and from power ratings from a fraction of a watt to over 50 watts. Zener diode 30 can be chosen within that range to provide a fairly stable reference voltage, $V_{REF}$. Coupled across terminals 14 and 16 is another voltage divider, a second voltage divider 34. Second voltage divider 34 includes a pair of series-connected resistors: resistor 36 and resistor 38. Resistors 36 and 38, as well as resistors 22, 24, 26 and 32, are preferably of large magnitude sufficient to limit current sink from positive terminal 14 to negative terminal 16, during times in which switch 40 is closed.

Switch 40 is an electromechanical device with metallic contacts for manually opening and closing an external electric circuit. Switch 40 provides connectivity of charge gauge circuit 18 between terminals 14 and 16. As such, when switch 40 is open, circuit 18 does not conduct current and thereby produces no power drain upon a battery pack connected between the terminals. Switch 40 is preferably a momentary contact switch which is normally in its open position. That is, switch 40 is not closed until the operator depresses the manual switch mechanism. Thus, circuit 18 is not active unless switch 40 is closed.

Once closed, switch 40 causes production of $V_{REF}$. Additionally, first and second voltage dividers 20 and 34 produce voltages at nodes within the divide network. First voltage divider 20 is capable of producing a $V_{MAX}$ at a first voltage divide node and a $V_{MIN}$ at a second voltage divide node. The second voltage divider 34 is capable of producing a $V_{SENSE}$ voltage at a first voltage divide node. In accordance with normal comparator operation, first comparator 42 output is driven to a logic low level if $V_{SENSE}$ on the inverting input exceeds $V_{MAX}$ on the non-inverting input. Similarly, output of second comparator 44 is driven to a logic low if $V_{SENSE}$ on the non-inverting input is less than $V_{MIN}$ on the inverting input. If first comparator 42 output is low, then diode 46 is forward biased, and first light emitting diode (LED) 48 is forward biased. A forward biased diode 46 ensures the inverting input of third comparator is less than the non-inverting input of comparator 50, due to sufficient resistor value of resistor 26. A forward biased first LED 48 emits a light intensity proportional to the current sent therethrough. First LED 48 emits a visible light at a wavelength set by the manufacturer. For example, first LED 48 can emit a green light. A suitable green light can be obtained at 569 nm from, for example, GaP substrate material doped with nitrogen.

A logic low at the output of second comparator 44 forward biases diode 52 as well as third LED 54. Third LED 54, when forward biased, can produce, for example, a red light at a wavelength of approximately 648 nm on a phosphorous-doped GaAs substrate. A logic low at the output of first and second comparators 42 and 44 is determined by the voltage at the inverting inputs of each of the comparators being greater than the voltage at the non-inverting inputs. Thus, activation of first LED 48 occurs whenever $V_{SENSE}$ is greater than $V_{MAX}$. If $V_{SENSE}$ is less than $V_{MIN}$, then third LED 54 will be active. If $V_{SENSE}$ is less than $V_{MAX}$ and is greater than $V_{MIN}$, then the outputs of first and second comparators 42 and 44 will be at a logic high thereby forcing the anode side of diodes 46 and 52 to be high via pull-up resistor 56. A high logic level at the anode of diodes 46 and 52 is purposefully higher than the voltage of $V_{MIN}$ thereby forcing output of third comparator 50 to a logic low. A low level voltage at the output of comparator 50 causes second LED 58 to turn on. An active second LED causes visible light, for example, a yellow light of, e.g., approximately 585 nm to be emitted. A yellow light can be emitted from, for example, a nitrogen-doped GaAs substrate.

It is appreciated from the circuit schematic of FIG. 1, that $V_{SENSE}$ is directly proportional to the voltage at positive terminal 14 (in relation to the voltage at negative terminal 16). If $V_{SENSE}$ is high (indicating a fully charged battery), then $V_{SENSE}$ is chosen to exceed $V_{MAX}$. $V_{MAX}$ is proportional to reference voltage, $V_{REF}$. If $V_{SENSE}$ exceeds $V_{MAX}$, then first LED 48 will be active and will illuminate a discrete visible light such as, for example, green. If $V_{SENSE}$ is less than $V_{MAX}$ but is greater than $V_{MIN}$, then second LED 58 will be active indicating, for example, a yellow light. If $V_{SENSE}$ is sufficiently small and is, for example, less than $V_{MIN}$, then third LED 54 will be active thereby emitting, for example, a red light.

The different wavelength visible light emitted from LEDs 48, 58 and 54 are indicative of the differences in charge of a battery connected between terminals 14 and 16. If the battery is fully charged, then $V_{SENSE}$ will exceed $V_{MAX}$ indicating a green LED. If the battery is nominally charged, $V_{SENSE}$ will be less than $V_{MAX}$ but greater than $V_{MIN}$, and a yellow LED will illuminate. If the battery is overly discharged, then $V_{SENSE}$ will be less than $V_{MIN}$, and a red LED will be active. Each LED is either fully on or fully off depending upon the logic level at the output of first, second, or third comparators. A bright line distinction of active LEDs aides the operator in determining battery status. When lit, the LEDs indicate battery status regardless of the surrounding light (ambient light) conditions. Even in direct sunlight, and illuminated LED can be clearly visible to the operator. Resistors 60, 62 and 64 can be adjusted to ensure that each LED is fully placed in the saturation region (and is therefore fully lit).

Resistor values chosen for resistors 22, 24, 26, 32, 36 and 38 are chosen to ensure that $V_{SENSE}$ can range from a value just above $V_{MAX}$ (when the coupled battery is overcharged) to a value just below $V_{MIN}$ (when the coupled battery is overdischarged). Resistor 32 is chosen of sufficient magnitude to provide constant current through zener diode 30 in order to provide a constant reference voltage, $V_{REF}$. Voltage values for $V_{SENSE}$, $V_{MAX}$, $V_{MIN}$ and $V_{REF}$ are defined by the resistor values in the following equations (assuming negative terminal 16 is at a common ground reference of, 0 volts):

$$V_{SENSE}=V_{BAT(+)}\times(R_{38}/(R_{38}+R_{36}))$$

$$_{MAX}=V_{REF}\times((R_{24}+R_{26})/(R_{22}+R_{24}+R_{26}))$$

$$V_{MIN}=R_{REF}\times(R_{26}/(R_{22}+R_{24}+R_{26}))$$

$V_{REF}$=zener diode 30 breakdown voltage

It will be appreciated to those skilled in the art having the benefit of this disclosure that this invention is believed to be capable of applications with numerous types of battery-powered portable electronic devices. The battery charge indicator can be retrofitted to existing portable products and can accommodate any battery configuration or a plurality of packaged batteries. Furthermore, it is also to be understood that the form of the invention shown and described is to be taken as a presently preferred embodiment. Various modifications and changes may be made to the circuit configuration provided the function remains substantially the same, as would be obvious to a person skilled in the art having benefit of this disclosure. It is intended that the following claims be interpreted to embrace all such modifications and changes and, accordingly, the specification and drawing are to be regarded in an illustrative rather than a restrictive sense.

What is claimed is:

1. A charge gauge circuit, comprising:
   a positive terminal, a negative terminal and a reference terminal, said positive terminal is adapted to receive a positive voltage, said negative terminal is adapted to receive a negative voltage and said reference terminal is adapted to receive a reference voltage exceeding the negative voltage and less than the positive voltage;
   a first voltage divider coupled between the reference and negative terminals, and a second voltage divider coupled between the positive and negative terminals;
   a first and second comparators, each comparator having inputs coupled to the first and second voltage dividers;
   a third comparator having inputs coupled to the first voltage divider and, through diodes, to outputs of the first and second comparators; and
   a select one of three light emitting diodes coupled to a respective one of said first, second and third comparators for emitting visible light responsive to the difference in magnitude of said positive and negative voltage.

2. The charge gauge circuit as recited in claim 1, wherein said first and second comparators are adapted for comparing a voltage level proportional to the positive voltage with a voltage level proportional to the reference voltage.

3. The charge gauge circuit as recited in claim 1, wherein said third comparator is adapted for comparing a voltage level proportional to an output of said first and second comparators with a voltage level proportional to the reference voltage.

4. The charge gauge circuit as recited in claim 1, wherein one of said three light emitting diodes emits radiation in the visible red wavelength, another one of said three light emitting diodes emits radiation in the visible yellow wavelength, and another one of said three light emitting diodes emits radiation in the visible green wavelength.

5. The charge gauge circuit as recited in claim 1, further comprising a normally open switch adapted for closure by application of manual force, said switch is coupled between said negative terminal and said first and second voltage dividers.

6. A battery charge indicator, comprising:
   a positive terminal and a negative terminal mounted within a battery-driven portable electronic device and adapted for frictional engagement across a battery;
   a charge gauge circuit coupled between the positive and negative terminals, said charge gauge circuit comprising:
   a first voltage divider coupled between a reference voltage and the negative terminal;
   a second voltage divider coupled between the positive terminal and the negative terminal;
   a first comparator having an inverting and a non-inverting pair of inputs, wherein the non-inverting input is coupled to a first voltage divide node within said first voltage divider and the inverting input is coupled to a first voltage divide node within said second voltage divider;
   a second comparator having an inverting and a non-inverting pair of inputs, wherein the inverting input is coupled to a second voltage divide node within said first voltage divider and the non-inverting input is coupled to the first voltage divide node within said second voltage divider;

a third comparator having an inverting and a non-inverting pair of inputs, wherein the inverting input is coupled through a diode to an output of each of said first and second comparators and the non-inverting input is coupled to the second voltage divide node within said first voltage divider; and three light emitting diodes coupled at respective outputs of each of the first, second and third comparators adapted for emitting visible light from one of said three light emitting diodes corresponding to the amount of charge within said battery.

7. The battery charge indicator as recited in claim 6, wherein said battery-driven portable electronic device is a laptop computer.

8. The battery charge indicator as recited in claim 6, wherein said first voltage divider comprises three resistors connected in series, and said second voltage divider comprises two resistors connected in series.

9. The battery charge indicator as recited in claim 6, wherein said reference voltage comprises a voltage exceeding a voltage applied to said negative terminal by a threshold amount.

10. The battery charge indicator as recited in claim 9, wherein said threshold amount corresponds to a voltage applied across a reverse-biased zener diode.

11. The battery charge indicator as recited in claim 6, wherein said first voltage divide node within said first voltage divider is adapted for receiving a voltage level higher than a voltage level upon said second voltage divide node within said first voltage divider.

12. The battery charge indicator as recited in claim 6, wherein said first voltage divide node within said second voltage divider is adapted for receiving a voltage level directly proportional to a voltage upon said positive terminal.

13. The battery charge indicator as recited in claim 6, wherein said first voltage divide node within said second voltage divider is adapted for receiving a voltage above a voltage upon said first voltage divide node within said first voltage divider for causing the output of said first comparator to transition to a state sufficient to activate one of said light emitting diodes connected directly thereto.

14. The battery charge indicator as recited in claim 6, wherein said first voltage divide node within said second voltage divider is adapted for receiving a voltage below a voltage upon said second voltage divide node within said first voltage divider for causing the output of said second comparator to transition to a state sufficient to activate one of said light emitting diodes connected directly thereto.

15. The battery charge indicator as recited in claim 6, wherein said first voltage divide node within said second voltage divider is adapted for receiving a voltage below a voltage upon said first voltage divide node within said first voltage divider and is further adapted for receiving a voltage above a voltage upon said second voltage divide node within said first voltage divider for causing the output of said third comparator to transition to a state sufficient to activate one of said light emitting diodes connected thereto.

16. The battery charge indicator as recited in claim 6, further comprising a normally open switch adapted for closure by application of manual force, said switch is coupled between the charge gauge circuit and said negative terminal.

\* \* \* \* \*